US010317495B2

(12) United States Patent
Jellus

(10) Patent No.: US 10,317,495 B2
(45) Date of Patent: Jun. 11, 2019

(54) METHOD AND COMPUTER USE OF AN MR OVERVIEW DATASET FOR RECONSTRUCTION OF MR RAW DATA

(71) Applicant: Siemens Healthcare GmbH, Erlangen (DE)

(72) Inventor: Vladimir Jellus, Kirchehrenbach (DE)

(73) Assignee: Siemens Healthcare GmbH, Erlangen (DE)

( * ) Notice: Subject to any disclaimer, the term of this patent is extended or adjusted under 35 U.S.C. 154(b) by 175 days.

(21) Appl. No.: 15/343,579

(22) Filed: Nov. 4, 2016

(65) Prior Publication Data
US 2017/0123032 A1    May 4, 2017

(30) Foreign Application Priority Data

Nov. 4, 2015   (DE) .................... 10 2015 221 573

(51) Int. Cl.
| G01V 3/00 | (2006.01) |
| G01R 33/56 | (2006.01) |
| G01R 33/561 | (2006.01) |
| G01R 33/565 | (2006.01) |
| G01R 33/54 | (2006.01) |

(52) U.S. Cl.
CPC ....... *G01R 33/5608* (2013.01); *G01R 33/543* (2013.01); *G01R 33/5611* (2013.01); *G01R 33/56545* (2013.01)

(58) Field of Classification Search
CPC .. G01R 33/34; G01R 33/34007; G01R 33/36; G01R 33/3635; G01R 33/3642;
(Continued)

(56) References Cited

U.S. PATENT DOCUMENTS

2008/0068016 A1   3/2008   Gaddipati et al.
2008/0175458 A1   7/2008   Guo et al.
(Continued)

OTHER PUBLICATIONS

Griswold et al., "Generalized Autocalibrating Partially Parallel Acquisitions (GRAPPA)," Magnetic Resonance in Medicine, vol. 47, pp. 1202-1210 (2002).
(Continued)

*Primary Examiner* — Thang X Le
(74) *Attorney, Agent, or Firm* — Schiff Hardin LLP

(57) ABSTRACT

In a method for creating a composite magnetic resonance (MR) raw dataset for an MR apparatus, a first MR raw dataset is determined from a first partial section of an examination object, in which a first region of the first MR raw dataset is not filled with MR signals and in which a second region of the first MR raw dataset is filled with MR signals. An MR overview dataset is determined, which has been acquired with a number of reception coils of the MR apparatus and for which an overall field of view of the number of MR coils is larger than a reception region of the number of MR receive coils. A partial dataset is determined from the MR overview dataset, which has MR signals that originate from the first partial section of the examination object from which the first MR raw dataset originates. MR partial raw data are reconstructed for the first region of the MR raw dataset, using the partial dataset determined. The composite MR raw dataset is created from the second partial region of the first MR raw dataset and the MR partial raw data.

8 Claims, 5 Drawing Sheets

(58) Field of Classification Search
CPC .. G01R 33/48; G01R 33/4818; G01R 33/481;
G01R 33/4824; G01R 33/446; G01R
33/4835; G01R 33/54; G01R 33/543;
G01R 33/561; G01R 33/563; G01R
33/565; G01R 33/5611; G01R 33/5612;
G01R 33/583; G01R 33/5659; G01R
33/56518; G01R 33/56536; G01R
33/56572; G01R 33/5614; G01R 33/5616;
G01R 33/56509; G01R 33/341; G01R
33/385; G01R 33/4828; G01R 33/56358;
A61B 5/055; A61B 5/0555; A61B
5/7278; A61B 5/725
USPC .................................................. 324/300–322
See application file for complete search history.

(56) References Cited

U.S. PATENT DOCUMENTS

| | | | |
|---|---|---|---|
| 2008/0317315 A1* | 12/2008 | Stemmer | G01R 33/56509 382/131 |
| 2009/0058419 A1* | 3/2009 | Kabasawa | G01R 33/56341 324/309 |
| 2010/0237865 A1 | 9/2010 | Stemmer | |
| 2013/0076357 A1* | 3/2013 | Grodzki | A61B 5/062 324/309 |
| 2013/0169273 A1* | 7/2013 | Grodzki | G01R 33/4816 324/309 |
| 2014/0361772 A1* | 12/2014 | Ritter | G01R 33/4838 324/309 |
| 2015/0015691 A1* | 1/2015 | Forman | A61B 5/7292 348/77 |

OTHER PUBLICATIONS

Breuer et al., "Controlled Aliasing in Parallel Imaging Results in Higher Acceleration (CAIPIRINHA) for Multi-Slice Imaging," Magnetic Resonance in Medicine, vol. 53, pp. 684-691 (2005).
Blaimer et al., "SMASH, SENSE, PILS, GRAPPA—How to Choose the Optimal Method," Top Magn Reson Imaging, vol. 15, No. 4, pp. 223-236 (2004).

* cited by examiner

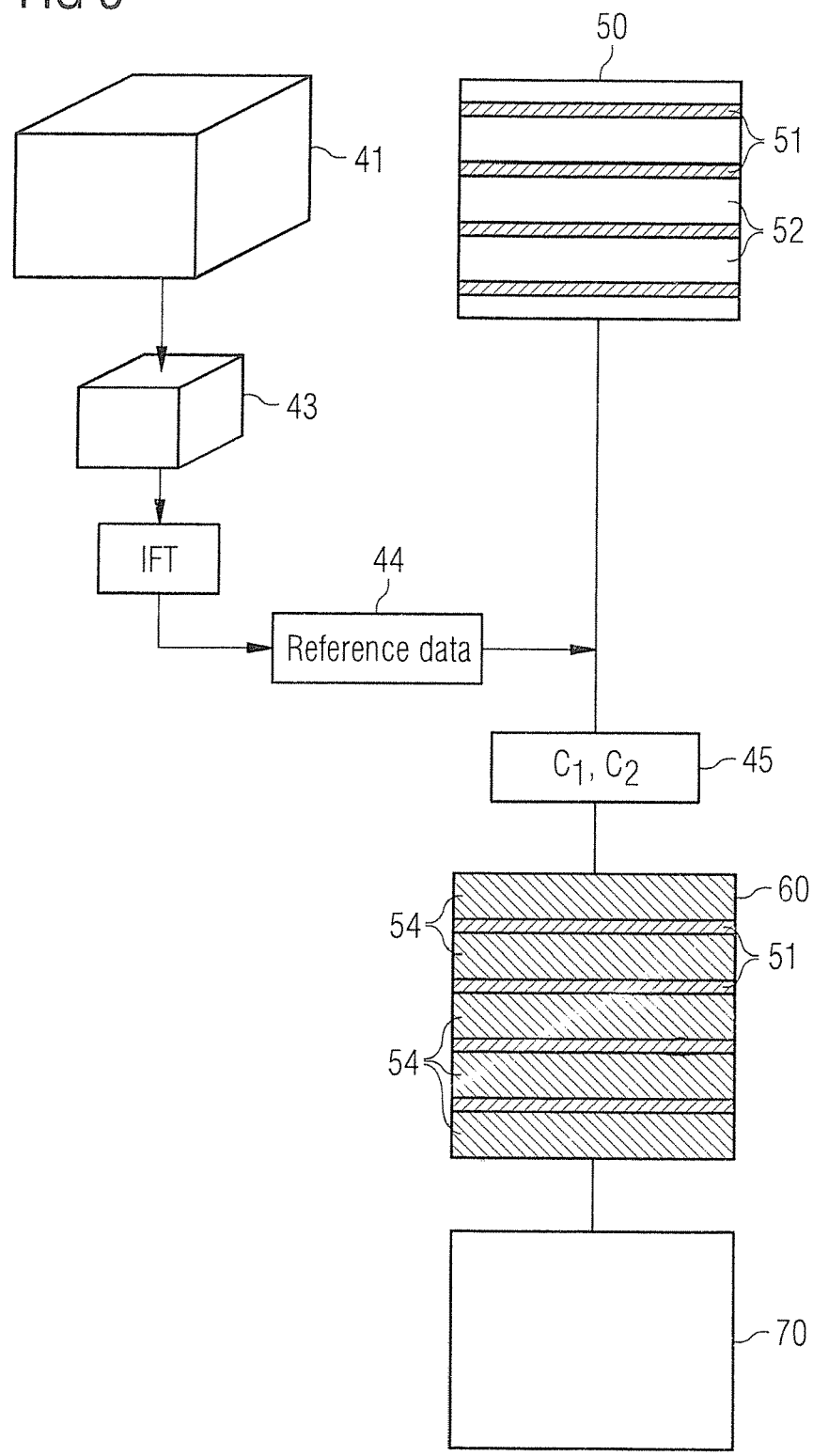

METHOD AND COMPUTER USE OF AN MR OVERVIEW DATASET FOR RECONSTRUCTION OF MR RAW DATA

BACKGROUND OF THE INVENTION

Field of the Invention

The present invention concerns a method for creating a composite magnetic resonance (MR) raw dataset for an MR apparatus, and a computer designed to create the composite MR raw dataset for the MR apparatus.

Description of the Prior Art

Magnetic resonance tomography (MRT), based on the physical phenomenon of nuclear magnetic resonance, has been known for many years as an imaging modality in medicine. The areas of application of magnetic resonance apparatuses (MR apparatuses) have been enlarged in recent years by faster imaging techniques. One approach for shortening the measurement time is to reduce the amount of MR raw data to be acquired, and the remaining missing raw data are either constructed with suitable algorithms, or the MR image with artifacts reconstructed from the reduced raw data must be corrected. A further option for enlarging the measurement volumes without prolonging the measurement time is the use of parallel imaging, in which a number of reception coils simultaneously receive the signal from the examination object. In this type of imaging, the MR signals are acquired by a coil array, wherein each coil acquires MR signals in this associated reception region independently of the other coils, and the combination of all coil signals is merged into an MR image. Such parallel imaging is based on two approaches. In a first approach the MR images of the individual reception coils, which have a reduced field of view, are reconstructed and the individual images are subsequently merged with knowledge of the individual coil sensitivities. This method carried out in the imaging space (domain) is known by the name "SENSE". The other possibility is to explicitly compute missing k-space segments or lines before image reconstruction, i.e. before the transformation of the raw data. These types of method are known by the names "SMASH", "GRAPPA", and "CAIPIRINHA".

With all these types of reconstruction, which take place in the image space or in the raw data space, additional MR calibration measurements are necessarily carried out, with which either the missing raw data lines or segments can be reconstructed in the raw data space, or with which the individual coil sensitivities are computed in the image space.

These calibration measurements can either be integrated into the actual imaging, so that in parallel imaging additional regions are acquired in the raw data space, or separate calibration measurements are carried out. Separate calibration measurement can only be used for the computation of GRAPPA coefficients. In GRAPPA reconstruction, an attempt is made, with a linear combination of measured raw data lines of an incomplete dataset, to reconstruct the non-measured raw data, wherein the linear combination is selected so that the raw data lines created during the reference measurement can be reconstructed.

Overall, however, the acquisition of the reference MR measurement lengthens the overall acquisition time.

SUMMARY OF THE INVENTION

An object of the present invention is thus to accelerate parallel imaging.

According to a first aspect of this invention, a method is provided for creating a composite MR raw dataset from an MR apparatus, wherein a first MR raw dataset is determined from a first partial section of an examination object, in which a first region of the first MR raw dataset is not filled with MR signals and in which a second region of the first MR raw dataset is filled with the MR signals. Furthermore an MR overview dataset is determined, which was acquired with the number of receive coils of the MR apparatus and for which an overall field of view of the number of MR coils is large enough to avoid aliasing. Furthermore a partial dataset is determined from the MR overview dataset, which has MR signals that originate from the first partial section of the examination object, from which the first MR raw dataset originates. Then, for the first region of the MR raw dataset, MR partial raw data can be reconstructed using the determined partial dataset, wherein the composite MR raw dataset is created from the second partial region of the first MR raw dataset and the MR partial raw data.

The second region of the first MR raw dataset was filled with raw data and the partial dataset from the MR overview dataset can be used for the reconstruction of the first region in the first MR raw dataset. Then, from this partial dataset, the missing raw data regions of the first MR raw dataset can be used for the reconstruction. For the acquisition of MR data with a number of receive coils in parallel, an MR overview dataset is always acquired at the beginning, which can then be used for example for image normalization or for the reconstruction in the image space, in order to compute the coil sensitivities. This dataset, the MR overview dataset, can then be used for the reconstruction of the missing raw data lines in the raw data space, so that extra calibration measurements can be dispensed with. This means that the overview dataset, which is used for image normalization, can be used as a calibration measurement for the determination of the missing raw data regions in the raw data space.

Preferably the MR overview dataset is a three-dimensional dataset, which was acquired by a number of receive coils. In this context it is advantageous that the MR overview dataset is acquired with mostly the largest possible field of view, however at least with a field of view that is large enough for there not to be any aliasing or artifacts in this MR overview dataset. This is the case, for example, when the measured field of view is larger than the visible object. Therefore this can be put to good use in order to reconstruct partial raw data for the first region of the MR raw dataset in which no MR raw data was acquired. This partial raw data does not exhibit any aliasing artifacts.

Furthermore, in the acquisition of the MR overview dataset, the MR signals of the examination object are mostly acquired simultaneously by the number of receive coils of the MR apparatus and by a whole-body coil of the MR apparatus. These datasets can then be compared with one another for computation of the individual coil sensitivities. For the present reconstruction of the MR partial raw data, however, the MR overview dataset that was acquired with the number of receive coils is used. From the MR overview dataset the partial dataset that originates from the same section of the examination object, the first partial section, can be defined in the image region. This partial dataset can then be transmitted into the raw data space by inverse Fourier transformation, which then forms the raw data, with which for example the linear coefficients can be defined during a GRAPPA reconstruction.

For example a segment can be determined from the MR overview dataset, which represents the first partial section of the examination region, wherein the segment is then transferred into the raw data space for determining the MR partial raw data, which can be used instead of the otherwise additionally acquired calibration raw data. The MR partial raw data thus replaces the calibration lines or segments of the raw data space otherwise acquired during the calibration measurement.

Furthermore a number of MR raw data segments can be determined from the second region of the first MR raw dataset and the number of MR raw data segments can be combined such that, with a combination of the number MR raw data segments, the partial dataset can at least be approximately partly reconstructed from the MR overview image dataset. For example it is possible for the number of MR raw data segments to be combined with a weighted linear combination, with which the number of raw data segments are weighted with weighting coefficients, wherein the weighting coefficients are determined such that the partial dataset is at least approximately partly reconstructed with the weighted linear combination.

The invention further relates to a computer that is designed to operate as described above.

The invention also encompasses a non-transitory, computer-readable data storage medium encoded with programming instructions that, when the storage medium is loaded into a computer of a magnetic resonance apparatus, cause the computer to execute the method according to the invention as described above.

BRIEF DESCRIPTION OF THE DRAWINGS

FIG. 5 shows schematically how missing raw data regions of a raw dataset can be reconstructed with the method of FIG. 4.

DESCRIPTION OF THE PREFERRED EMBODIMENTS

Figure 1:
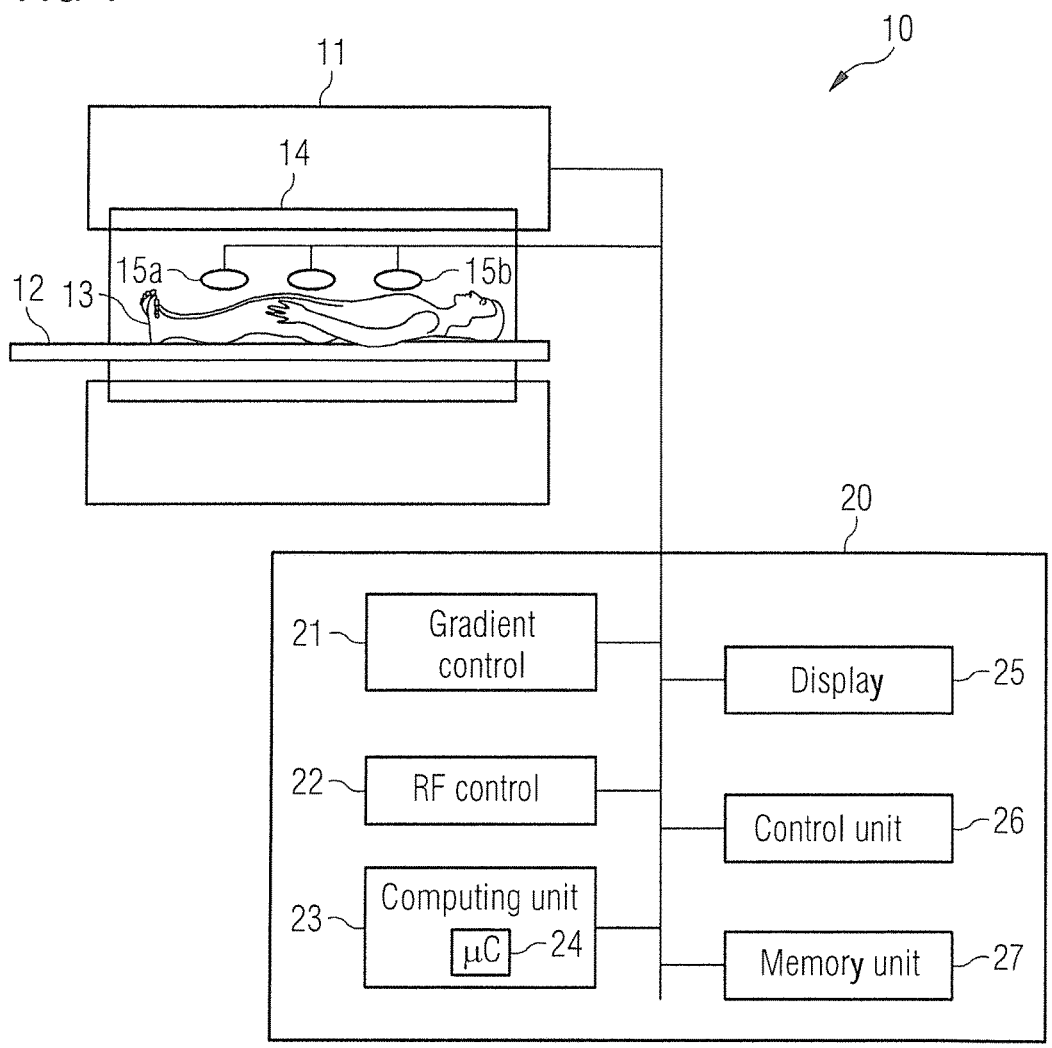
FIG. 1 is a schematic illustration of an MR apparatus with a computer that is designed to determine, from an MR overview dataset, the MR raw data missing for the reconstruction.

The description given below describes how calibration data can be created in an MR apparatus from MR overview data, which can then be used for reconstruction of non-acquired raw data in the raw data space, as is the case inter alia with GRAPPA or CAIPIRINHA. Naturally the method can also be used with other reconstruction methods.

The MR apparatus 10 has a data acquisition scanner that has a basic field magnet 11 for creating a polarization field B0. A person being examined is arranged on a table 12 or the examination object 13 is moved into the center of the magnet 11, in order for locally encoded magnetic resonance signals can be acquired from the examination object 13 with a whole-body coil 14 or a number of local coils 15a, 15b. The invention is in particular able to be used in so-called parallel imaging, in which MR signals are acquired simultaneously with the number of local coils 15a, 15b, a coil array of local coils. By radiation of radio-frequency pulses and switching of magnetic field gradients, the magnetization created by the polarization field B0 can be diverted from the state of equilibrium and locally encoded, and the magnetization produced is detected by the reception coils, which may be the body coil 14 or the local coils 15a, 15b. The gradient coils for creating the magnetic field gradients are not shown in the figures for clarity. How MR images can be created by radiating RF pulses and by switching magnetic field gradients in various sequences is known to those skilled in the art and need not be explained in any greater detail herein, with the exception of FIGS. 2 and 3, where the GRAPPA reconstruction method in accordance with the prior art is briefly discussed.

The MR apparatus further has a central controller 20, which is used to control the MR device. The central controller 20 has a gradient controller 21 for controlling and switching the necessary magnetic field gradients. An RF controller 22 is provided for controlling and switching the RF pulses to deflect the magnetization. A computer 23 with at least one processor 24 is provided for controlling the different modules in the central controller 20. The MR images can be shown on a display 25 and an operator can control the MR apparatus 10 via a control console 26. Furthermore a memory 27 is provided, in which program modules can be stored that, when they are executed by the computer 23 or the processor 24, control the execution sequence of the MR imaging or the computation of a composite MR raw dataset, as will be explained below in detail.

Figure 2:
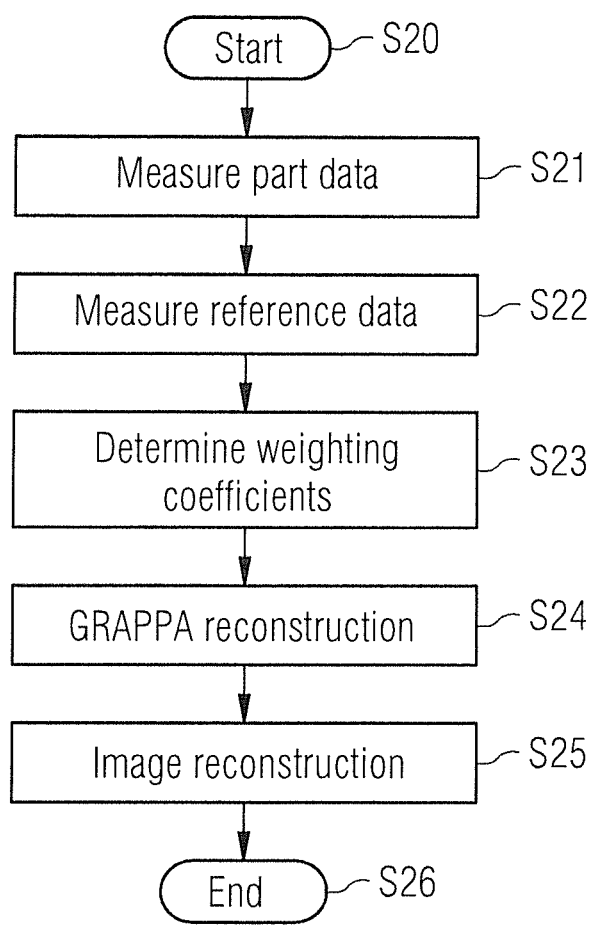
FIG. 2 is a flowchart of the steps for determining missing MR raw data in accordance with a GRAPPA method, as known in the prior art.
Figure 3:
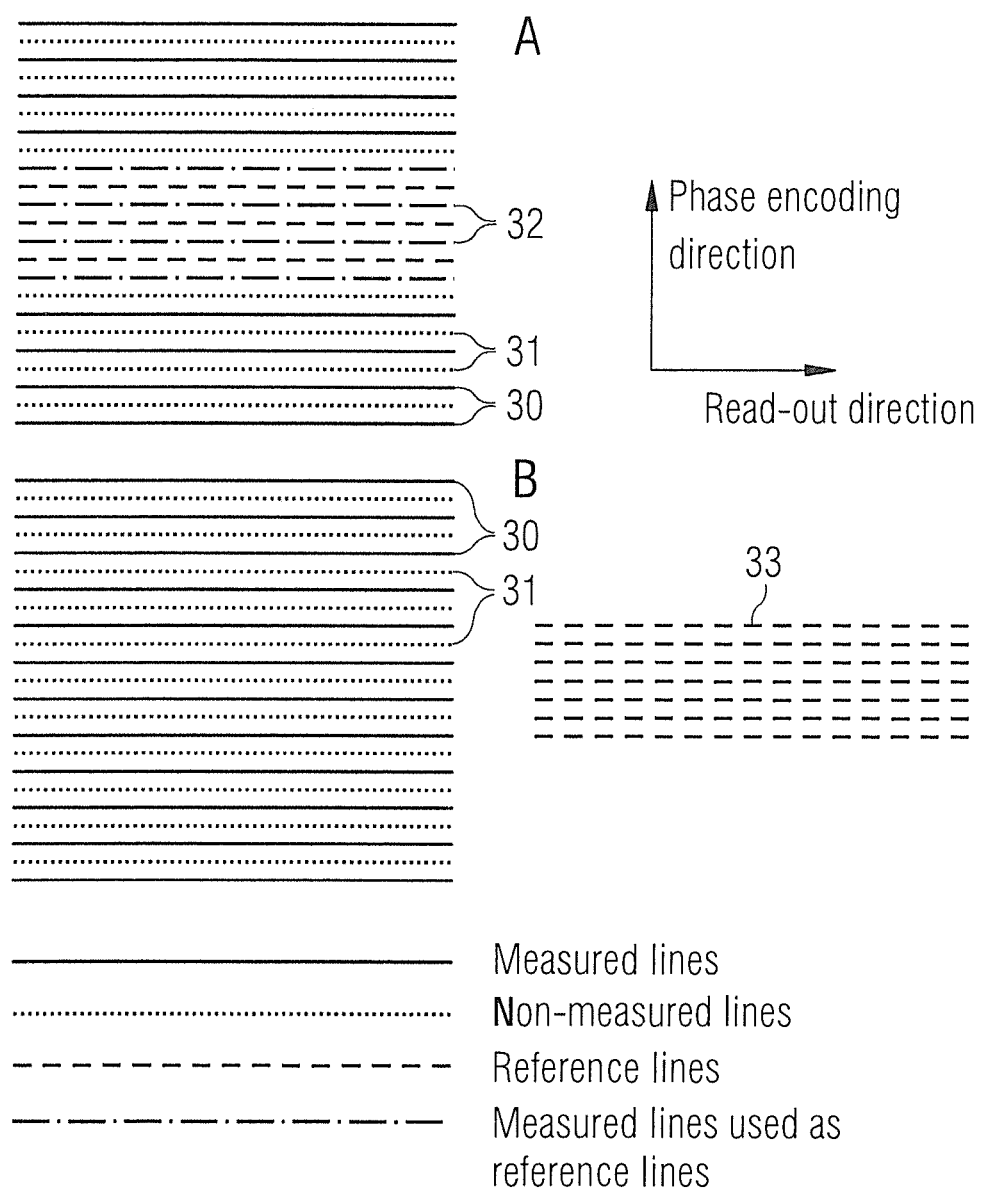
FIG. 3 shows a method for creating calibration measurement data, as is known in the prior art in a GRAPPA reconstruction.

FIGS. 2 and 3 describe how the MR raw data are acquired and the missing raw data is reconstructed for a GRAPPA reconstruction method. The method starts in step S20. In step S21 the partial data are measured. Referring to FIG. 3, in step S21 the raw data or k-space lines 30 are acquired, wherein these raw data lines are acquired with a parallel imaging technique with the number of receive coils 15a, 15b. In step S22 the reference data or reference measurements are carried out. Referring to FIG. 3, in the lower part of FIG. 3, which is marked B, these are the reference lines 33, which have been acquired in a separate measurement. In part A of FIG. 3 the reference lines are the lines 32. In both measurements the lines 31 designate the missing raw data lines for the complete measurement of the raw data space or k-space. The measurement shown at the top in FIG. 3 differs from the lower measurement by the reference lines 32 being acquired simultaneously, i.e. during the acquisition of the raw data lines 30, and not in a separate measurement as in the lower part of FIG. 3.

Then, in step S23, the computation of the missing raw data lines starts. For this, as is known in the GRAPPA method, weighting coefficients are determined for the measured raw data lines, the lines 30 of FIG. 3. The aim is, by linear combination of a few raw data lines, especially neighboring raw data lines, to reconstruct non-measured raw data lines lying between them. For this purpose, the reference lines 32 or 33 are used, wherein the weighting coefficients are determined in step 23 so that with a linear combination of the measured data lines, the measured reference lines can be reconstructed as well as possible. If the weighting coefficients are now known, the other non-measured raw data lines 31 of FIG. 3 can also be reconstructed, which is designated in FIG. 2 in step S24 as GRAPPA reconstruction. If the entire data space is then filled with raw data lines, the image can be reconstructed in step S25, wherein the method ends in step S26.

Figure 4:
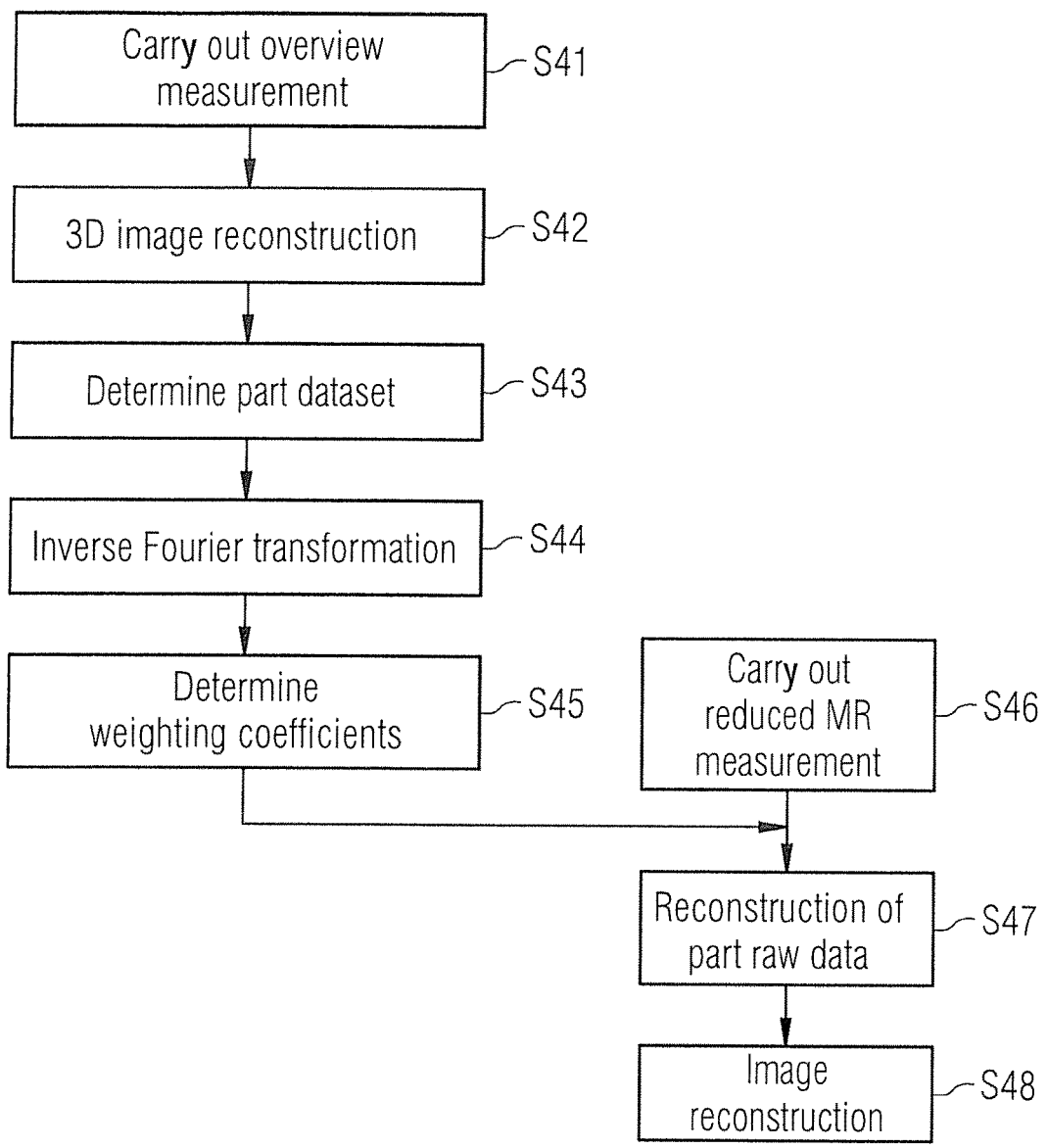
FIG. 4 is a flowchart for creating a composite MR raw dataset according to an embodiment of the invention.

Referring to FIGS. 4 and 5, an inventive method is now described as to how non-acquired raw data lines of a first raw dataset can be reconstructed using MR overview images. To do this, in step S41 of FIG. 4, an overview measurement is carried out, which is acquired for image normalization or for the parallel imaging of the SENSE technique, and which is a three-dimensional overview measurement, which has been acquired with a number of receive coils 15a, 15b of FIG. 1. Mostly this overview measurement is carried out so that the MR signals will still be acquired simultaneously with the whole-body coil 14. By comparison of MR signals, which are acquired with the coil 14 and the different coils 15a, 15b, the individual coil sensitivities of the local coils 15a, 15b can be computed, which is not of any importance in the present invention however. In the present invention the overview measurement is carried out and the MR data acquired with the number of receive coils are merged to form an MR overview dataset 41. Of importance in carrying out this overview measurement is that the overall field of view of the number of MR coils is large enough for no aliasing or no artifacts to be produced in the reconstruction. For this purpose, the field of view that is used for the measurement should be larger than the examination object. The 3D image reconstruction can take place in step S42. Likewise, in a step S46, a reduced MR measurement of a partial region of the examination object can be carried out, in which, as is shown in FIG. 5, an MR raw dataset 50 is created, which has a region 51 that is filled with raw data and a region 52 that is not filled with raw data. Measurement time can be saved by not completely measuring the raw data space. However the regions 52 not filled with raw data must be reconstructed, before a substantially artifact-free image can be reconstructed. Step S46 of FIG. 4 is preferably carried out sometime after step S42, can however also be carried out before step S41 or S42. The steps S43-S45 explained in detail later can be carried out here before or after carrying out step S46 or at the same time as step S46. Since not all raw data regions of the first raw dataset 50 are filled with raw data, in a step S43 a partial dataset is created from the overview dataset 41.

In FIG. 5 this partial dataset is labeled with reference character 43. This part from the overview dataset contains spatial MR signals from the section of the examination object from which the first raw dataset 50 was also created. This partial dataset 43 can now be used as reference data 44, wherein, as is shown in step S44, a further inverse Fourier transformation is carried out beforehand, in order to obtain reference data in the raw data space or k-space. The entire reference data, i.e. the entire partial dataset 43 or just parts thereof, as shown in FIG. 2, for example the middle raw data lines, can now be used as reference data, in order, as has been explained in FIG. 2, to create weighting coefficients 45 in step S45. This makes it possible to reconstruct the partial raw data 54 that fills the regions 52. Thus a composite MR raw dataset 60 is achieved that is completely filled with raw data. The partial raw data 54 are reconstructed, referring to FIG. 4, in step S47, wherein subsequently in step S48 the image reconstruction of a complete raw dataset can take place, which leads to MR image 70 of FIG. 5.

The described method enables to overall acquisition time to be reduced, since the reference data needed for the reconstruction can be obtained from the overview measurement. This overview measurement is needed in any event for acquisition with a number of reception coils to improve the homogeneity of the images, for possible phase corrections. It is also possible to use an overview measurement for a number of subsequent MR measurements, i.e. for a number of MR raw datasets 50. Furthermore the method described in FIGS. 4 and 5 can also improve the image quality. The calibration information from the overview measurement can also reduce other foldover artifacts.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for creating a composite MR raw dataset for an MR apparatus, comprising:
   providing a computer with an MR raw dataset acquired from a section of an examination subject that encompasses only a portion of the examination subject, with a first region of said MR raw dataset not being filled with MR signals and a second region of said MR raw dataset being filled with MR signals;
   providing said computer with an MR overview dataset that encompasses an entirety of the examination object, acquired with a selected number of reception coils of the MR apparatus for which an overall field of view of the selected number of MR coils is large enough to avoid aliasing in the MR overview dataset;
   in said computer, determining a partial dataset from said MR overview dataset comprising MR signals originating from said section of the examination subject from which said MR raw dataset originates;
   in said computer, reconstructing MR partial raw data for said first region of said MR raw dataset using said, partial, dataset determined from the MR overview dataset; and
   in said computer, generating a composite MR raw dataset from said second partial region of said MR raw dataset and said MR partial raw data, and making the composite MR raw dataset available from the computer in electronic form as a data file.

2. The method as claimed in claim 1 comprising providing said computer with a three-dimensional dataset as said MR overview dataset.

3. The method as claimed in claim 1 comprising providing said computer with said MR overview dataset that comprises MR signals acquired simultaneously by said selected number of reception coils.

4. The method as claimed in claim 3 comprising, in said computer, determining, from the MR overview dataset, a segment that represents said section of the examination subject, and transferring said segment into raw data space to determine said MR partial raw data.

5. The method as claimed in claim 1 comprising reconstructing said MR partial raw data in said computer by:
   determining a number of MR raw data segments from said second region of said MR raw dataset; and
   combining the number of MR raw data segments to produce a combination of the number of MR raw data segments that allows said MR partial raw dataset to be reconstructed from said MR overview image dataset.

6. The method as claimed in claim 5 comprising combining said number of MR raw segments in said computer with a weighted linear combination, in which the number of raw data segments is weighted with respective weighting coefficients that are determined to cause said MR partial raw dataset to be approximately partially reconstructed with said weighted linear combination.

7. A computer for creating a composite MR raw dataset for an MR apparatus, said computer comprising:
   an input configured to receive an MR raw dataset acquired from a section of an examination subject that encompasses only a portion of the examination subject, with a first region of said MR raw dataset not being filled with MR signals and a second region of said MR raw dataset being filled with MR signals;

said input interface being configured to also receive an MR overview dataset that encompasses an entirety of the examination object, acquired with a selected number of reception coils of the MR apparatus for which an overall field of view of the selected number of MR coils is large enough to avoid aliasing in the MR overview dataset;

a processor configured to determine a partial dataset from said MR overview dataset comprising MR signals originating from said section of the examination subject from which said MR raw dataset originates;

said processor being configured to reconstruct MR partial raw data for said first region of said MR raw dataset using said partial dataset determined from the MR overview dataset; and said processor being configured to generate a composite MR raw dataset from said second partial region of said MR raw dataset and said MR partial raw data, and to make the composite MR raw dataset available from the computer via an output interface in electronic form as a data file.

8. A non-transitory computer-readable data storage medium encoded with programming instructions, said storage medium being loaded into a computer and said programming instructions causing said computer to:

receive an MR raw dataset acquired from a section of an examination subject that encompasses only a portion of the examination subject, with a first region of said MR raw dataset not being filled with MR signals and a second region of said MR raw dataset being filled with MR signals;

receive an MR overview dataset that encompasses an entirety of the examination object, acquired with a selected number of reception coils of the MR apparatus for which an overall field of view of the selected number of MR coils is large enough to avoid aliasing in the MR overview dataset;

determine a partial dataset from said MR overview dataset comprising MR signals originating from said section of the examination subject from which said MR raw dataset originates;

reconstruct MR partial raw data for said first region of said MR raw dataset using said partial dataset determined from the MR overview dataset; and generate a composite MR raw dataset from said second partial region of said MR raw dataset and said MR partial raw data, and make the composite MR raw dataset available from the computer in electronic form as a data file.

* * * * *